US010056538B1

(12) United States Patent
Boyd

(10) Patent No.: US 10,056,538 B1
(45) Date of Patent: Aug. 21, 2018

(54) METHODS FOR FABRICATION, MANUFACTURE AND PRODUCTION OF ENERGY HARVESTING COMPONENTS AND DEVICES

(71) Applicant: FACE INTERNATIONAL CORPORATION, Norfolk, VA (US)

(72) Inventor: Clark D Boyd, Portsmouth, VA (US)

(73) Assignee: Face International Corporation, Norfolk, VA (US)

( * ) Notice: Subject to any disclaimer, the term of this patent is extended or adjusted under 35 U.S.C. 154(b) by 89 days.

(21) Appl. No.: 15/095,063

(22) Filed: Apr. 9, 2016

(51) Int. Cl.
| | |
|---|---|
| H01L 35/00 | (2006.01) |
| H01L 27/16 | (2006.01) |
| H01L 35/34 | (2006.01) |
| H01L 35/02 | (2006.01) |
| H01L 25/03 | (2006.01) |
| G02F 1/1335 | (2006.01) |

(52) U.S. Cl.
CPC ........ H01L 35/34 (2013.01); G02F 1/133526 (2013.01); H01L 25/03 (2013.01); H01L 35/02 (2013.01)

(58) Field of Classification Search
CPC ......... H01L 35/02; H01L 35/32; H01L 25/03; H01L 35/00; H01L 27/16; H01L 21/00; G02F 1/133526
USPC ............ 136/200; 438/57; 257/462; 359/237
See application file for complete search history.

(56) References Cited

U.S. PATENT DOCUMENTS

| | | | |
|---|---|---|---|
| 4,639,009 | A | 1/1987 | Yatabe et al. |
| 5,637,946 | A | 6/1997 | Bushman |
| 6,120,857 | A | 9/2000 | Balooch et al. |
| 6,946,596 | B2 | 9/2005 | Kucherov et al. |
| 9,269,775 | B2 | 2/2016 | Choi et al. |
| 9,444,031 | B2 * | 9/2016 | Park ............... H01L 41/113 |
| 9,589,802 | B1 | 3/2017 | Hatem et al. |
| 2008/0169195 | A1 | 7/2008 | Jones et al. |
| 2014/0230875 | A1 | 8/2014 | Angermann et al. |
| 2015/0243867 | A1 | 8/2015 | Geballe et al. |
| 2016/0035956 | A1 | 2/2016 | Carroll et al. |
| 2016/0043260 | A1 | 2/2016 | Nemanich et al. |
| 2016/0111564 | A1 | 4/2016 | Gidwani et al. |

* cited by examiner

*Primary Examiner* — Matthew T Martin
(74) *Attorney, Agent, or Firm* — Daniel A. Tanner, III

(57) ABSTRACT

A method for forming a unique, environmentally-friendly energy harvesting element is provided. A configuration of the energy harvesting element causes the energy harvesting element to autonomously generate renewable energy for use in electronic systems, electronic devices and electronic system components. The energy harvesting element includes a first conductor layer, a low work function layer, a dielectric layer, and a second conductor layer that are particularly configured in a manner to promote electron migration from the low work function layer, through the dielectric layer, to the facing surface of the second conductor layer in a manner that develops an electric potential between the first conductor layer and the second conductor layer. An energy harvesting component is also provided that includes a plurality of energy harvesting elements electrically connected to one another to increase a power output of the electric harvesting component.

25 Claims, 8 Drawing Sheets

800

810

820
810

830
820
810

840
830
820
810

850
840
830
820
810

811
850
840
830
820
810

METHODS FOR FABRICATION, MANUFACTURE AND PRODUCTION OF ENERGY HARVESTING COMPONENTS AND DEVICES

This application is related to U.S. patent application Ser. No. 15/095,061, entitled "Energy Harvesting Components And Devices," filed on Apr. 9, 2016, and U.S. Pat. No. 9,786,718, entitled "Integrated Circuit Components Incorporating Energy Harvesting Components/Devices, And Methods For Fabrication, Manufacture And Production Of Integrated Circuit Components Incorporating Energy Harvesting Components/Devices," which issued on Oct. 10, 2017, and U.S. Pat. No. 9,793,317, entitled "Devices And Systems Incorporating Energy Harvesting Components/Devices As Autonomous Energy Sources And As Energy Supplementation, And Methods for Producing Devices And Systems Incorporating Energy Harvesting Components/Devices," which issued on Oct. 17, 2018, and the disclosures of which are hereby incorporated by reference herein in their entirety.

BACKGROUND

1. Field of the Disclosed Embodiments

This disclosure relates to implementation of a scheme for fabrication, manufacture and/or production of a unique, environmentally-friendly energy harvesting capacity, device and/or component for providing autonomous renewable energy, or a renewable energy supplement, in electronic systems, electronic devices and electrically-energized system components.

2. Related Art

Technologic advance over the last several decades, particularly since the advent of solid-state circuits and circuit components, has seen a veritable explosion in the numbers and types of electronic systems, electronic devices, and electronic system components that are routinely employed by individuals, companies and other corporate entities, and governmental entities and/or agencies for communication, information exchange, manufacturing improvement, tracking/surveillance, health monitoring, personal entertainment and the like. Machine-controlled processes improve information flow, manufacturing precision, information exchange, and individual convenience in virtually every area of daily life.

Structures of all types are environmentally monitored and controlled by electronic sensor, anomaly detection, security and climate control components. Vehicles of all types include electronic navigation communication, and health monitoring systems. Electronic data exchange and communication have become an all-too-necessary staple of commercial efficiency and individual convenience. Cellular telephones, often supported by powered wireless microphones, have become fairly ubiquitous in today's communicating environment.

Portable computing devices of all forms including tablet-type computers and other forms of hand-held personal digital assistant (PDA) devices keep individuals' documents, personal and professional calendars, lists and contact information, reference and presentation materials, photo albums, music and other entertainment sources, and the like. These devices facilitate numerical calculations, timekeeping and all forms of data storage keeping close at hand necessary and/or desired information for a particular user in the conduct of his or her employment functions and personal tasks and/or enjoyment.

At a comparable rate, miniaturized, transistorized, solid-state, and other powered devices and/or system components are finding their way increasingly into many and widely-varied technology areas. Robotic devices are increasingly replacing manual laborers in performing certain routine repetitive tasks, and even in implementing intricate computer-aided design and manufacturing of components and component structures that cross a broad spectrum of manufacturing and piece/part production functions. The precision available in the use of electronically machine-implemented instructions far surpasses that available by the efforts of even the most skilled artisan.

Many technologies have been enabled and/or aided by the implementation of transistorized, miniaturized and other solid-state devices and device components. A broad spectrum of medical devices, for example, from digital thermometers to glucometers to hearing aids to pacemakers to all manner of personal health monitoring components, relying on miniaturized sensors and solid-state circuitry for monitoring, augmentation and communication of information regarding often-critical health parameters of individuals.

Governmental, law enforcement and personal security and surveillance efforts and capabilities are implemented using fixed and mobile sensors. Many individuals and entities are making increasing use of arrays of fixed sensor components that are easily deployed and routinely monitored, as well sensors field-deployed on a wide array of unmanned vehicles, including small unmanned aerial systems, carrying increasingly sophisticated monitoring and surveillance suites.

Particularized commercial embodiments of devices and systems that were not even conceived of a decade ago are finding their way into the commercial marketplace, many for making individuals' lives more convenient in the increasingly fast-paced world of data communication and information exchange. These include, for example, deployable and/or monitorable security tokens by which individuals can track everything from their keys, to their luggage, to their kids, to their vehicles. Thirty years ago, who among us may have considered of the existence of an electronic cigarette?

Electronic, and electronically-based, systems aid in production efficiency and in precision. Consider the increasing number of retail establishments using, almost exclusively, electronic payment systems, or at least electronic components for counting one's change.

To say that everything is becoming increasingly electronically-controlled is an understatement. Common to all of these electronic systems, electronic devices, and/or electronic system components, is the need for the electronic systems, electronic devices, and/or electronic system components to be powered. Power requirements take all forms. These include requirements to provide certain constant power supplies, for example, to volatile digital data storage components, security sensor components, health monitoring devices, timing units and the like. They also include separate and/or related requirements to be able to provide renewable or rechargeable on-demand power to any one of the above-mentioned communication, information exchange, or sensor devices in a manner that allows those devices to be generally autonomously operated apart from being tied to some bulky, or limited mobility, power source or power supply.

The global power requirement to support the above non-exhaustive list of use cases, which may also include one's electric watch for precisely telling time, one's electronic rangefinder for precisely measuring that next shot on the golf course, one's electronic firearm sights for precisely firing the weapon, and one's remote control devices of every form, shape and function, for conveniently changing the channels on the TV, opening the garage door, and/or starting the car, to name but a few, is, in the aggregate, immense.

Supporting a global power requirement necessitates the expending of natural, naturally occurring, and/or manufactured/refined resources. The storehouse of available resources may have a limit at which those resources may be depleted. Concerns further arise not only regarding the ultimate availability of the resources, but also with respect to the adverse effects that may arise with respect to the conversion of certain of those resources to a usable energy production output.

Advancing research efforts and resultant technologies with regard to many of the above non-exhaustive list of use cases have, in many instances, systematically reduced the individual power requirements for providing intermittent, or even constant, power to myriad electronic devices, and electronic components housed within larger components systems. Renewable energy technologies are pursued that seek to further reduce the global impact of overall energy production by attempting to meet increasingly-efficient power requirements or constraints, with increasingly environmentally-friendly energy sources.

SUMMARY

As the individual electronic component or unit power requirements are reduced, it may be advantageous to find implementing electrical power generation and delivery strategies, and to design and fabricate electrical power generation components that could be usable in portable electronic devices, and the electronic components housed within such devices, for example, to supplant, or at least augment, chemical battery, or other source, power generation and delivery to those devices or components in an environmentally friendly, and renewable, power source.

Exemplary embodiments of the systems and methods according to this disclosure may provide energy harvesting devices and components ("energy harvesters," EH elements, or EH components) that are uniquely configured to provide measurable electrical output for supplying power to electronic systems, electronic devices and/or electrically-powered system components.

Exemplary embodiments may provide a method for forming a unique EH element or EH component structure that harnesses usable power at an atomic level and packages the usable electronic potential in a form that may be usable to autonomously power an electronic system, electronic device, and/or electrically-powered system component according to a generally renewable physical reactions for thermal conversion at the atomic level in the EH element or EH component structure.

Exemplary embodiments may form structures that convert available thermal energy at any temperature above absolute zero to a usable electrical potential in embodiments in which an ability to maintain a static electric potential between electrodes may be useful.

Exemplary embodiments of the fabricated structures may convert thermal energy at any temperature above absolute zero to a usable electrical output from an EH element or EH component in order to continuously, or intermittently, power an electronic system, electronic device and/or electrically-powered system component.

Exemplary embodiments may provide a usable electrical power output at any temperature above absolute zero, and without exposure to any separate energy generating source. In embodiments, the disclosed EH elements and/or EH components may be usable to internally generate usable electrical power in environments that are devoid of any ambient light.

Exemplary embodiments may advantageously employ physical properties of particularly manufactured and conditioned conductors, at an atomic level, to beneficially employ characteristic electron motion, and channeling of that electron motion between conductors in a usable manner by optimally conditioning surfaces of opposing conductors to have measurably different work functions.

In embodiments, electrons are predictably and advantageously caused to migrate from a comparatively low work function surface of a first conductor in a direction of, and to accumulate on, a comparatively high work function surface of a second conductor thereby establishing an electric potential between the first and second conductors.

In embodiments, quantum tunneling effects are optimized to promote the electron migration from the low work function conductor surface and accumulation of the electrons on the comparatively high work function opposing (or facing) electrode surface.

Exemplary embodiments may optimize particular dielectric material structures interposed between the comparatively low work function conductor surface and the comparatively high work function facing conductor surface to promote optimized or enhanced rates of electron migration to, and accumulation on, the comparatively high work function surface of a facing electrode.

Exemplary embodiments may produce individual conductor-dielectric-conductor "sandwiched" energy harvesting elements.

Exemplary embodiments may aggregate pluralities of EH elements as particularly-formed EH components for delivery of conditioned electrical power as an autonomous power source or as a supplement to another power source supplying power to electrical and/or electronic components.

Exemplary embodiments may provide particularly-formed EH components for electrically powering integrated circuitry, and/or integrated circuits. In embodiments, the EH components may be formed as a part, or portion, of the integrated circuit component.

These and other features, and advantages, of the disclosed systems and methods are described in, or apparent from, the following detailed description of various exemplary embodiments.

BRIEF DESCRIPTION OF THE DRAWINGS

Various exemplary embodiments of the disclosed systems and methods relating to implementations of a scheme for fabricating, producing or otherwise forming a unique, environmentally-friendly energy harvesting capacity, device and/or EH element/component for providing autonomous renewable energy, or a renewable energy supplement, in electronic systems, electronic devices and electrically-powered system components, will be described, in detail, with reference to the following drawings, in which.

DETAILED DESCRIPTION OF EMBODIMENTS

Figure 1:
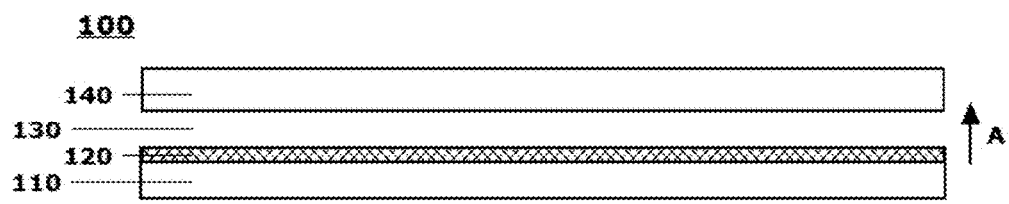
FIG. 1 illustrates a schematic diagram of a first exemplary embodiment of an EH element according to this disclosure.

The systems and methods according to this disclosure relate to implementations of schemes for fabricating, forming or otherwise producing a unique, environmentally-friendly energy harvesting capacity, device and/or EH component for providing autonomous renewable energy, or a renewable energy supplement, in electronic systems, electronic devices and electrically-powered system components. The disclosed EH component may be particularly formed according to a micro fabrication process on the sub-micron scale to advantageously employ vibrational electron motion in a particularly advantageous manner to render a measurable electrical potential in, or to provide a measurable electrical output from, an EH component composed of multiple "sandwiched" EH elements according to a particular combination of physical structures that combine certain physical effects to provide the output electrical power at virtually all temperatures above absolute zero, and in ambient light devoid environments.

The disclosed schemes advantageously configure physical structures to channel electron motion, at the atomic level, in a manner that provides a measurable and useful electrical output. As power requirements for certain electronic devices continue to decrease, the disclosed structures of EH components may be advantageously employed to autonomously meet those power requirements, or to provide electrical energy generation capacity by which to supplement other available power sources typically known to be provided for powering mobile and/or remote devices where routine recharge, or battery replacement, currently presents a non-optimized operational configuration. The disclosed power generation structures and capabilities, and the scalability of the resources and outputs, have been, in a first instance, experimentally reproduced in a laboratory environment.

Reference will be made to the employment of the disclosed exemplary energy harvesters, EH elements, or EH components to a number of real world beneficial purposes. The discussion of any particular use case for application of the disclosed schemes should not be considered as limiting the disclosed subject matter to employment with any particular class of electrical component, electrical circuit, electronic device, or any particular electrically-driven system component. It should be recognized that any advantageous use of the disclosed schemes for employing a particularly-configured EH component according to the described embodiments to effect autonomous energy supply, or energy-supply supplementation, employing systems, methods, techniques, processes and/or schemes such as those discussed in detail in this disclosure is contemplated as being included within the scope of the disclosed exemplary systems and methods. In this regard, the disclosed systems and methods will be described as being particularly adaptable to providing measurable electrical power to certain electronic systems, electronic/electrical devices, and/or electrically-powered system components as easily-understandable and non-limiting examples of particularly advantageous uses of the disclosed EH elements and/or EH components. General reference throughout this disclosure will be made to particular use cases in which EH elements and/or EH components may be usable in the manner described above. Reference to any particular one of these use cases is not intended to exclude other use cases in which the disclosed EH elements and/or EH components may be otherwise employed.

Reference to any particularly useful compositions of the materials from which the disclosed component layers of the EH elements and/or EH components may be formed and combined in the sub-micron scale are also descriptive only of broad classes of input materials that may be used. Suitable materials for such several Ångström-thick to tens of nanometers thick layers may be discussed specifically according to their composition, or may be more broadly referred to by certain functional parameters, neither of which should be considered to limit the scope of available input materials of which conductor layers, low work function layers and/or dielectric layers may be formed.

FIG. 1 illustrates a schematic diagram of a first exemplary embodiment of an EH element 100 according to this disclosure. In a simplest form, the disclosed schemes are directed to particular configurations of components for generating an electrical potential in the presence of minimal ambient heat. As shown in FIG. 1, a particular arrangement of the disclosed EH element 100 may be in a form of a multi-layered component structure including at least a pair of opposing conductor layers (conductors) 110, 140 set at a small interval (less than 100 nm) with respect to one another. The small interval between the conductors 110, 140 may be optimized to advantageously make use of a known quantum tunneling effect, as will be described in greater detail below.

Conductor 110 represents one of the output terminals for the harvested energy from the EH element 100. A surface of conductor 110 facing conductor 140 may be conditioned in a manner described below to lower a work function of the facing surface of the conductor 110. In embodiments, this conditioning may be in the form of surface treating the conductor 110 with a particular low work function material, or in a form of depositing a separate particular low work function layer 120 on the facing surface of the conductor 110. This low work function layer 120 may be in intimate contact with the facing surface of the conductor 110 and may be relatively thin, on an order of Ångströms, in thickness.

The low work function layer 120 may have additional surface modifications made to it that further reduce a work function of the low work function layer 120.

A dielectric "layer" 130 may exist between the low work function layer 120 on the facing surface of the conductor 110, and the facing surface of the conductor 140. Those of skill in the art recognize that a dielectric layer may be in the form of a vacuum or an air gap, which is according to the depiction of the dielectric "layer" 130 in FIG. 1, and may also be in the form of a solid or liquid dielectric material, as shown in other exemplary embodiments discussed below. As noted above, the dielectric "layer" 130 is very thin. Thus, a dielectric "layer" 130, as depicted in FIG. 1, while possible, may be comparatively more difficult to engineer in that the dielectric "layer" 130 must maintain separation between the low work function layer 120 and the facing surface of the conductor 140. As will be described in greater detail below with reference to the exemplary embodiment in FIG. 2, the dielectric layer may comprise a physical structure which, for example, may have piezoelectric particles incorporated on its surfaces, or throughout its structure.

Conductor 140 is the other of the output terminals for the harvested energy and has a facing surface with a relatively higher work function and a low resistance to reduce losses. According to the mechanics of the disclosed schemes, the structure shown in FIG. 1, and in like manner the structures in FIGS. 2-4, may produce a static electric field that may, be usable even without discharging elements, or attachment to a load, to produce, for example, a usable static electric field for employment in known use cases including for biasing a transistor.

It is known that electrons have a certain amount of energy that is generally described according to Schrödinger's wave equation. It is unclear where the electron is precisely located, but it is contained in certain space around the atom. Work function is the energy required, usually specified in electron volts (eV), for the electrons to leave a surface of a material (often a metal surface) and to migrate, for example, into a vacuum facing the surface of the material. In solid-state physics, the work function is the minimum thermodynamic work (i.e., energy) needed to remove an electron from a surface of a solid to a final electron position separated from the surface of the solid on the atomic scale, but still too close enough to the surface of the solid to be influenced by ambient electric fields. The work function is not a characteristic of the bulk material, but rather is a property of the surface of the solid or material.

As temperature increases above absolute zero, the electrons become more energetic and more easily leave the surface of the solid. When below the energy required by the work function for the electrons to leave the surface of the solid, there is a small probability that the electrons will leave the surface. In other words, this is not an on and off function. Statistically, a particular electron may have more energy than the average energy of the surrounding electrons and may more easily migrate away from the surface of the solid. So, random electrons may still leave the surface even when the temperature is below that which the work function indicates may allow the electrons to be energized enough to more freely leave the surface. As a work function of a particular surface is decreased in a donor (or emitter) surface, as in the surface conditioning of conductor 110 with a low work function layer 120 described above, or according to any one of a number of different mechanisms (as will be described below), it becomes easier for larger numbers of electrons to leave the donor surface and migrate toward the receptor surface with the comparatively higher work function. It is more difficult for electrons to freely leave the receptor surface based on the higher work function.

A simplified description of the operation of the structural embodiments according to this disclosure may be characterized as follows. The work function of the free electrons in the conductor 110 is lowered enough by surface conditioning or the presence of the low work function layer 120 such that the free electrons leak into and through the very thin dielectric "layer" 130 in direction A by the mechanism of quantum tunneling at room temperatures. A similar process is occurring in the opposite direction from conductor 140, but at a rate that is orders of magnitude lower due to the comparatively high work function of the material of the facing surface of conductor 140.

When a particularly low work function (less than 1.0 eV) material, e.g., silver oxide cesium, is employed as the donor or emitter surface, a comparatively larger number of electrons leave the surface at room temperature. When another surface is employed, like copper or gold, which has a comparatively higher work function (5.0 eV) at room temperature then, the donor or emitter surface releases comparatively much larger numbers of electrons than the receptor surface. Is should be noted that differences in work function in the opposing conductor faces or surfaces of as little as 1.0 eV may produce usable electrical output from the disclosed structures. Quantum tunneling effects are a necessary component of the disclosed schemes and are implemented through the minimal proximities, across the dielectric layer 130, of the facing surfaces of the conductors 110, 140 and the presence of the low work function conditioning, or low work function layer 120, on the surface of the conductor 110.

At rest, given the proper combination materials, there is always going to be energy transfer from the donor or emitter surface to the receptor surface based on the above-described designed differences in work function of the respective surfaces. In this manner, the transfer of electrons, in a managed and predictable manner, is directed from a particular donor or emitter surface to a particular receptor surface. In embodiments, this is accomplished by conditioning the respective surfaces and placing them in properly close proximity to each other. The unique design placement of the respective layers generally described above results in a previously unforeseen, and previously unachievable, measurable electrical power potential or output.

The electron migration process described above continues until the electric potential is high enough to stop further accumulation of electrons in the facing surface of the receptor, conductor 140. The electron accumulation on the facing surface of conductor 140 may be considered to be substantially equivalent to the electron depletion in the conditioned facing surface of conductor 110.

When an electrical circuit is completed between the conductors 110, 140 (in a manner similar to that shown in FIG. 5) electrons flow via the electrical circuit pathway from the conductor on which the electrons are accumulated (the receptor conductor with the comparatively high work function facing surface) to the conductor from which the electrons migrated across the dielectric layer internal to the EH element (the donor or emitter conductor with the comparatively low (and conditioned) work function surface) to equalize the charges and thus the collected thermal energy manifested as controlled electron migration between respective conductor surfaces is converted to electrical energy. With the static equilibrium state having been disturbed, the migration of electrons from the donor or emitter surface to the receptor surface re-commences.

The donor or emitter surface conductor 110 and the receptor surface conductor 140 may be comprised of good conductor materials in order to complete the electrical path by conducting electricity well, e.g., with little inherent resistance. To drive a lower work function in a surface of the conductor 110, a different material can be combined with the conductor 110 by, for example, surface treating the conductor 110 with an oxide and potentially nitrogen to turn the surface of the conductor 110 into a form of a semiconductor lowering the work function of the surface of the conductor 110. As indicated above, it is not a matter of what happens throughout the mass of the conductor 110, but rather the focus is on what happens at the surface. The material from which the conductor 110 is formed simply needs to provide a good conduction to complete the electrical path.

Figure 2:
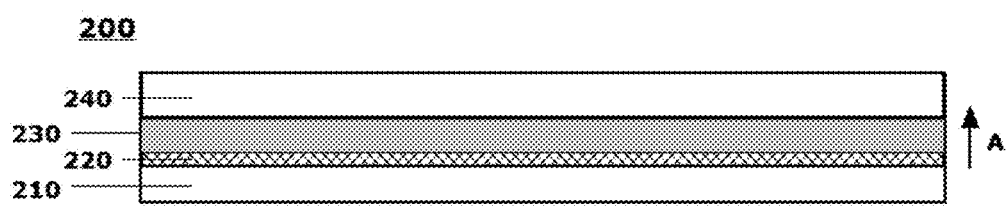
FIG. 2 illustrates a schematic diagram of a second exemplary embodiment of an EH element according to this disclosure.

FIG. 2 illustrates a schematic diagram of a second exemplary embodiment of an EH element 200 according to this disclosure. As shown in FIG. 2, a particular arrangement of the disclosed EH element 200 may again be in a form of a multi-layered component structure including at least a pair of opposing conductor layers (conductors) 210, 240 set on either face of a thin (less than 100 nm, and in embodiments on an order of 20-60 nm) dielectric layer 230.

Typical conductor materials, by themselves, exhibit comparatively high work functions without a semiconductor or other surface treatment. As a result, any opposing conductor 240 may, in an unconditioned state, have a surface that inherently displays a comparatively high (or higher) work function. For a dielectric layer, a vacuum or an air gap (in the manner shown in FIG. 1) may present certain challenges in a repeatable manufacturing process based on the small clearances between the low work function layer and the high work function facing surface of the opposing conductor. In this regard, some type of dielectric composition (solid or liquid) may be provided as a formed dielectric layer 230 in order to provide positive separation between the low work function surface of conductor 210, or the low work function layer 220, and the facing surface of the opposing conductor 240.

The presence of the material structure of the dielectric layer 230 addresses a difficulty in how to maintain opposing conductive layers nanometers apart over comparatively large areas based on the proportional scales at which the EH elements may be manufactured. The dielectric (or semiconductor) layer 230 may substantially ensure that the electrons transfer from the low work energy surface 220 to the comparatively higher work energy surface of the conductor 240, while also ensuring that the two conductors 210, 240 do not internally short one another. The presence of the formed dielectric layer 230, or a presence of any dielectric, does not determine a direction of the flow of electrons (see arrow A). That direction of flow is determined according to the differential work functions in the respective donor or emitter, and receptor, surfaces. The dielectric layer 230 does, however, provide the spacer for facilitating the flow of electrons from the low work function surface layer 220 to the high work function facing surface of the opposing conductor 240. This positive separation ensures that the only path by which electrons can return to the low work function surface is through any attached load. See FIG. 5.

As noted, electrons will randomly leave the surfaces. In the structures particularly implemented according to the disclosed schemes, comparatively few electrons will leave the high work function surface while comparatively large numbers of electrons will migrate from the low work function surface. Any cloud of electrons accumulating in between the respective surfaces repel each other as the electrons cross the dielectric gap toward the higher work function surface that accepts free electrons and holds them because of the high work function characteristic of that surface.

It has been long recognized that a very weak, but manageable, transfer of electrons is exhibited, or may be facilitated, between surfaces at a particular temperature, i.e., with no temperature differential between the surfaces, conceptually in contravention of the Second Law of Thermodynamics. See generally Fu et al., "Realization of Maxwell's Hypothesis—A heat-electric conversion in contradiction to Kelvin's statement," arXiv:physics/0311104 [physics.gen-ph] (Nov. 20, 2003) (describing an electron transfer phenomena in an induced magnetic field where both parallel surfaces are at a same temperature, theoretically violating the Second Law of Thermodynamics). The disclosed schemes for particularly presenting structures in which opposing surfaces of conductor layers are conditioned to have differentiable work functions, and are placed in close enough proximity to substantially ensure a quantum tunneling effect overcome the shortfalls, which those of skill in the art generally accepted, in providing consequential and usable electrical power out of the disclosed EH elements and EH components.

As mentioned above, quantum tunneling is an essential characteristic of the disclosed embodiments. Consider the process of atomic-force microscopy (AFM) which presents a type of scanning probe microscopy (SPM) with demonstrated resolution on the order of fractions of a nanometer. In that process, information is gathered by "feeling" or "touching" a surface with a mechanical probe. Piezoelectric elements that facilitate tiny, but accurate and precise movements on command enable very precise scanning. AFM uses the phenomenon of quantum tunneling to increase a current that jumps the gap between the surface and the probe tip. This is a phenomenon that was generally accepted not to occur at all at very low voltages. Current varies exponentially as a distance to the surface, a distance between (1) the probe tip and (2) the surface that the probe tip is mapping, is kept between, for example, 25 and 100 nm. As the probe tip is scanned across the surface, individual atoms modulate the current significantly. The distance is adjusted and the surface is mapped.

The tunneling effect can be effectively controlled. At about a 200 nm gap, the tunneling effect essentially disappears. At around 20 nm, however, the exponential function of the current increases significantly. A wave function begins to overlap the receptor conductor as the gap between the conductors is precisely controlled. Based on this overlap, the free electrons can be trapped by the high work function surface to become a part of the free electron cloud of the receptor conductor. The high work function surface maintains its high barrier against release. As such, residual release of electrons, potentially for tunneling, back in the other direction is significantly limited.

Not only are the compositions of the surfaces important according to materials from which they are formed, the internal topography of the donor (or emitter) and receptor surfaces are also important (the texture is important on a molecular level). In areas in which a surface topography comes to a sharp point, clusters of atoms are collected and/or congregated. At these points, the electric field is particularly focused. Any allegedly completely flat surface will include certain texture in its surface topography that will promote higher tunneling effect in the respective raised areas.

Embodiments that take additional advantage of this phenomenon may be described below with respect to, for example, FIGS. 3 and 4.

A unique enhancement in the disclosed layered arrangement schemes lies in consistently structurally implementing these quantum tunneling effects that are not seen at a macro-level. It is the channeling of this quantum tunneling effect that causes (or promotes) enough electron transfer to generate an effective and measurable current through the load, where the conductor layers are separated in the tens of nanometers range from one another.

The dielectric layer 230 may be formed of candidates including aluminum oxide (AlO3) and Paralyne. Dielectric candidates with large bulk gaps include fluorinated Stanene. The dielectric layer 230 may be very thin, in a range of a monolayer of atoms or molecules to layers that are about 2000 times that thickness. The dielectric layer 230 may be uniform or varied in material composition. It also may be fully densified or porous with gas or vacuum within any voids that may be present. By definition, the dielectric layer 230 should minimize electrical conduction. In embodiments, the dielectric layer may be 20 to 60 nm, to as much as 100 nm, thick in order to increase the quantum tunneling effect. A thinner dielectric layer 230 may be preferable in its capacity to promote higher electron migration according to the quantum tunneling affects, better utilizing a tail of the wave function. The thicker the dielectric layer 230 beyond 100 nm, for example, significantly reduces the quantum tunneling effect. There may be a lower limit, however, to a thickness of the dielectric layer 230 formed of a particular material in that at very thin layers, dielectric breakdown may occur.

The effects that may be harnessed according to the disclosed schemes are based on the presence of the low work function surface. The high work function surface will generally be at a work function in a range of 2+eV compared to 1.0 eV or less, for example, 0.8-0.6 eV (and theoretically even as low as 0.1 eV) in the low work function surface. When these surfaces are brought into the near contact with one another, separated by a dielectric layer in the manner described above, electron transfer occurs at a previously unanticipated rate. This electron transfer causes an electrical potential to accumulate in the layered EH element structure. As with any other electrical power source, when a load is connected to the power source, certain depletion of the electrical potential occurs. Consider that the electrons flow from the high work function surface conductor through the load to the low work function surface conductor. The equilibrium between the low work function surface on the high work function surface is disturbed and electron transfer between those surfaces re-commences or continues.

In a particular embodiment, the low work function layer may be comprised of a carbon nitride film deposited by, for example, an RF reactive magnetron sputtered graphite carbon in an N2 discharge. The effective work function for the carbon nitride films may be determined using the Fowler-Nordheim equation to be in a range of 0.01-0.1 eV. The substrate temperature of 200° C., floating potential at the substrate, and nitrogen partial pressure of 0.3 Pa may be favorable to promote the reaction that lowers the work function. Emitting-current density (J) may follow the Fowler-Nordheim (FN) relation:

$$J = \frac{AE^2}{<} \exp\left(-\frac{B<^{3/2}}{E}\right)$$

where A and B are constant, is the dimensionless field enhancement factor, and E and < are the external electric field and the work function, respectively. From this relationship, reducing the work function is mathematically shown as an effective means to enhance electron transfer/migration. Apart from, or in addition to, selecting particular materials for reducing the work function of, or associated with, a first conductor, possible physical mechanisms of reducing the work function may include the charge tunneling, surface roughening, or nano-structuring that enlarge the local curvature of the surface of the donor or emitter conductor. Chemical adsorption may be employed as well, noting, however, that only the field emission governed by the chemical adsorption on the surface of the conductor is intrinsic.

A non-limiting list of candidate substrates and/or surface treatments, in addition to those mentioned above, includes the following:
  Single layer graphene
  Lanthanum hexaboride or LaB6
  Double-Barrier Quantum Well Structure (AlSb/GaSb/AlSb resonant tunneling diode structure)
  Carbon nitride coating
  Carbon nitride plus boron nitride surface film
  AgOCe
  Ga-doped ZnO nanoneedle surface for enhanced electric field gradient
  Conductor surface treating with an ionization process
  RF-reactive sputtered graphite carbon The differential in work function between the higher work function layer and the low work function layer may be mediated, controlled or otherwise adjusted (even optimized) based on a composition of the material forming the intermediate layers at or between the surfaces of the donor and receptor layers of the conductors, or, for example, based on differential surface treatments of the individual donor and receptor surfaces of the conductors. For the purposes of this disclosure, a surface treatment of the donor or receptor surfaces of the conductors may be considered to be, or otherwise to contribute to, the intermediate layer structure, including the dielectric layer, separating the donor and receptor surfaces.

Exemplary embodiments described and depicted in this disclosure should not be interpreted as being specifically limited to any particular configuration of an EH element or EH component structure, except insofar as particular dimensions, as disclosed, are determined to enhance the described electrical power generation capabilities. Additionally, although candidate materials may be specified for each of the conductors, the low work function surface layer or surface layer conditioning, the dielectric layer and the like, the disclosed embodiments should not be interpreted as being limited to any of the specific examples cited, or to any particular individual materials for forming the particular layers of each EH element. This includes, but is not limited to, any particular composition of the conductor materials, any particular composition of the low work function layer (or coating or treatment), or any particular composition of the dielectric layer (to include as a vacuum, as an air gap, as a liquid, and/or as a solid (of a homogeneous or non-homogeneous composition)).

Figure 3:
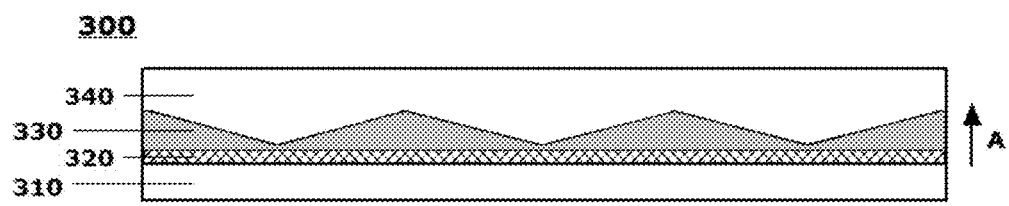
FIG. 3 illustrates a schematic diagram of a third exemplary embodiment of an EH element according to this disclosure.

FIG. 3 illustrates a schematic diagram of a third exemplary embodiment of an EH element 300 according to this disclosure. As shown in FIG. 3, a particular structure of the disclosed EH element 300 may again be in a form of a multi-layered component structure including at least a pair of opposing conductor layers (conductors) 310, 340 set on either face of a thin (typically less than 100 nm, and in embodiments on an order of 20-60 nm) dielectric layer 330.

FIG. 3 depicts certain variation in a structure of the dielectric layer 330. The dielectric layer 330 may, in the same manner as described above with regard to the dielectric layer 230 depicted in FIG. 2, be porous on a nanoscale. A particular compound may be placed in the pores. It should be noted that not all materials are, in fact, porous on the nanoscale. There are certain materials that are "densified" enough to be nonporous, even on the nanoscale. In these materials, there is not an opening large enough for even the smallest atom to fit through. Most materials may exhibit porosity to some degree, but when certain material formation techniques are undertaken including, for example, vapor deposition, a particular material may be rendered nonporous on the atomic or nanoscale. In embodiments, the dielectric layer 330 may be porous in order that the other material can be inserted in the pores.

In embodiments, the other material may be comprised of metal cations in a water ($H_2O$) solution, for example, that can enhance thermal energy harvesting. Examples of the metal cations include: Nickel Chloride, Copper Chloride, Ferric Chloride, Potassium Chloride, or most metal Sulfates, Iodides, Bromides, and/or Fluorides.

A mechanism for the additional induced voltage is based on the electro-mechanical interaction (not chemical reaction) between graphene and a metal cation in solution. For example, using a single Cu2+ with the same kinetic energy as the {Cu2+} in a water solution at room temperature, only the interaction between the single Cu2+ and the graphene, symmetrically above the carbon ring for simplicity, may be considered. The total energy of the graphene-Cu2+ system is calculated by the Perdew-Bure-Ernzerhof (PBE) method. The first equilibrium state is located at a separation of d1 between the Cu2+ and the center of a carbon ring. When the distance between the Cu2+ and graphene is larger than d1, the total energy of the system stays constant, which means no energy conversion occurs between them. Those of skill in the art recognize that, at room temperature, the Cu2+ cation has a velocity of approximately 300 meters per second. When the distance approaches d1 (due to ambient thermal atomic motion), the total energy of the system can be increased by 4.6 eV. When 4.6 eV energy is transferred to graphene from the Cu2+ by inelastic collision, the Fermi level of the graphene shifts up by 1 eV compared to its Dirac point. This means that an electron is emitted out of the graphene carbon ring and becomes free to travel along the graphene.

Further, FIG. 3 is intended to depict a side view of the dielectric layer 330 formed to have a nonlinear pattern. Such a feature in the physical construct of the dielectric layer 330 may enhance the activity (motion) of the electrons through the dielectric layer 330 between the low work function surface 320 of the conductor 310 and the high work function surface of the conductor 340. The nonlinear structure, or patterning, in the dielectric layer 330 enhances the thermal activity of the electrons.

A non-linear structure to the dielectric layer 330, as included in this disclosure, refers to a locally or overall tapered microstructure which will induce significantly enhanced activity (motion) of the electrons at the "small" ends or locally small end portions in a manner similar to that described below.

Figure 4:
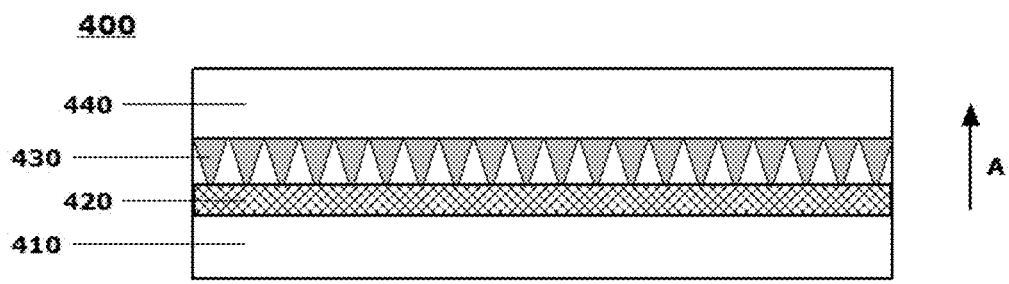
FIG. 4 illustrates a schematic diagram of a fourth exemplary embodiment of an EH element according to this disclosure.

FIG. 4 illustrates a schematic diagram of a fourth exemplary embodiment of an EH element 400 according to this disclosure. As shown in FIG. 4, a particular arrangement of the disclosed EH element 400 may again be in a form of a multi-layered component structure including at least a pair of opposing conductor layers (conductors) 410, 440 set on either face of a thin (typically less than 100 nm, and in embodiments on an order of 20-60 nm) dielectric layer 430. A low work function surface treatment, or low work function surface layer 420 may be applied to a face of the conductor 410 to promote electron migration from the surface of the conductor 410, or from the surface layer 420, in a direction of a surface face of an opposing conductor 440 in direction A as shown.

FIG. 4 depicts another variation in a structure of the dielectric layer 430. In this embodiment, the dielectric layer 430 may be particularly formed, at least in part, as a series of horn structures the small end of the horns terminating at the low work function layer 420. Such a structure may enhance the activity of the electrons at the interface of the low work function layer 420 with the small ends of the horned structure of the dielectric layer 430 making it easier for the electrons to escape. Ionic liquids (not shown) may be employed to fill the voids in the dielectric layer 430 created by such a structural arrangement. For embodiments intended to be used in particularly cold environs, the liquid dielectric component may not be included. As depicted, broad ends of the horn structures of the dielectric layer 430 may contact the high work function surface of the conductor 440.

Regarding these conical shapes, because the energy is equal to one half the velocity squared times the mass ($E=\frac{1}{2}mv^2$), as a cross-section decreases and the mass therefore decreases, in a resonant structure, the velocity must increase a square root of the decrease in the mass. The taper may be adjusted based on the acoustic impedance and velocity of the material so that the energy distribution remains uniform, thus translation toward the smaller end requires increasing velocity. This phenomenon too has been documented on the atomic level. The electron energy, therefore, is further enhanced simply by a unique configuration of the mechanical structure of the dielectric layer 430.

Figure 5:
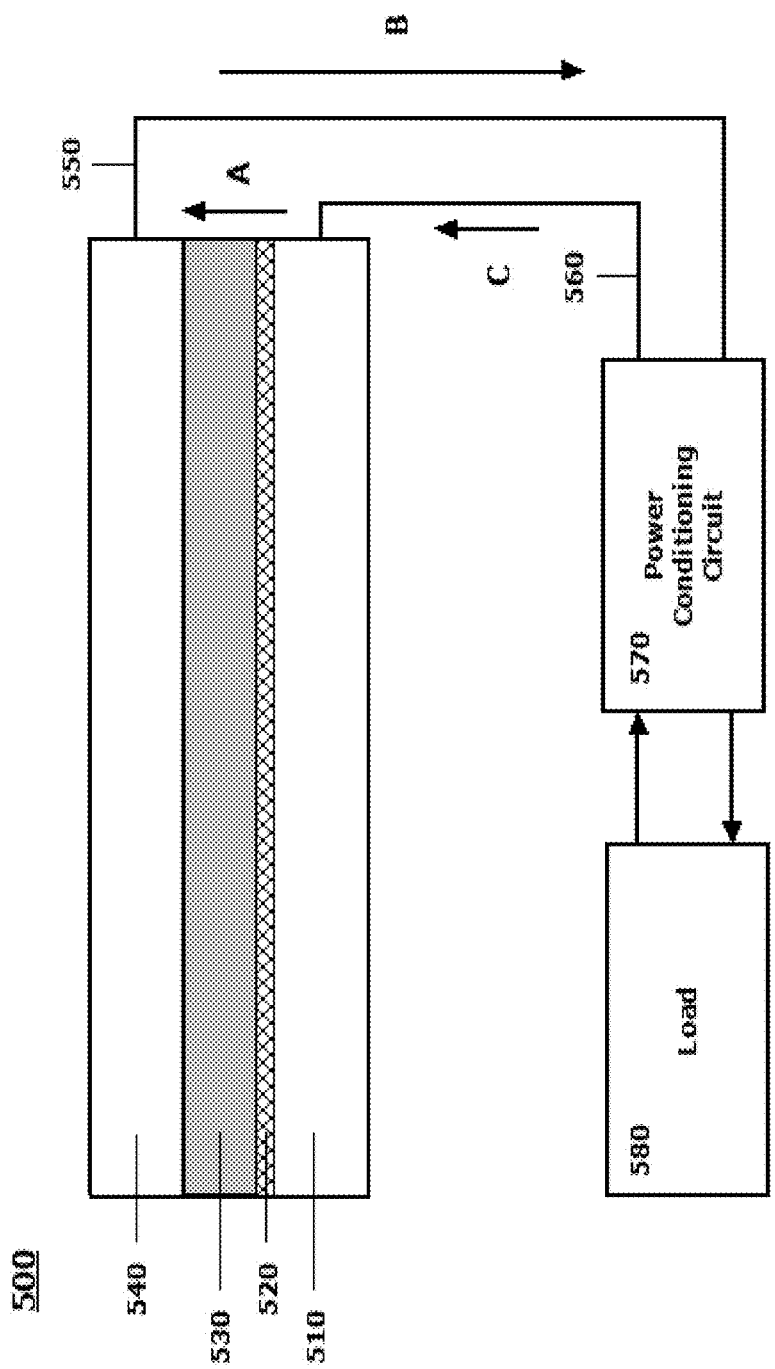
FIG. 5 illustrates a schematic diagram of an exemplary embodiment of a simple circuit powered by an EH element according to this disclosure.

FIG. 5 illustrates a schematic diagram of an exemplary embodiment of a simple circuit 500 powered by an EH element according to this disclosure. The arrangement of the EH element is in a form of the multi-layered component structure including at least a pair of opposing conductors 510, 540 set on either face of a thin (typically less than 100 nm, and in embodiments on an order of 20-60 nm) dielectric layer 530. A low work function surface treatment, or low work function surface layer 520, may be applied to a face of the conductor 510 to promote electron migration from the surface of the conductor 510, or from the surface layer 520 in a direction of a surface face of an opposing conductor 540 in direction A as shown.

In order to obtain power from the EH element, leads 550, 560 may be connected for routing to and through a load 580. Controlling the current flow through the load 580 provides a capacity to power the load 580 at discrete intervals, or when properly modulated, substantially continuously. Load regulation may not be very good from the EH element itself. As such, the power source may be conditioned by conditioning circuitry via, for example a power conditioning circuit 570. Appropriately conditioned, the available energy could provide a constant power source, or may be cycled. In embodiments, the load 580 may be matched to the power source and a continuous supply of power could be provided to an appropriately-sized load 580.

If a rate at which the electrons are returned through the external circuitry flowing from the conductor 540 of the EH element (the receptor surface conductor) through the lead 550 in direction B, optionally to a power conditioning circuit 570 and to and through the load 580, and then via the lead 560 in direction C to the conductor 510 (the donor surface conductor), the load 580 could be powered continuously and forever. Conventional power conditioning or power matching concepts may be applicable to load match the load to the available power from the EH element.

Figure 6:
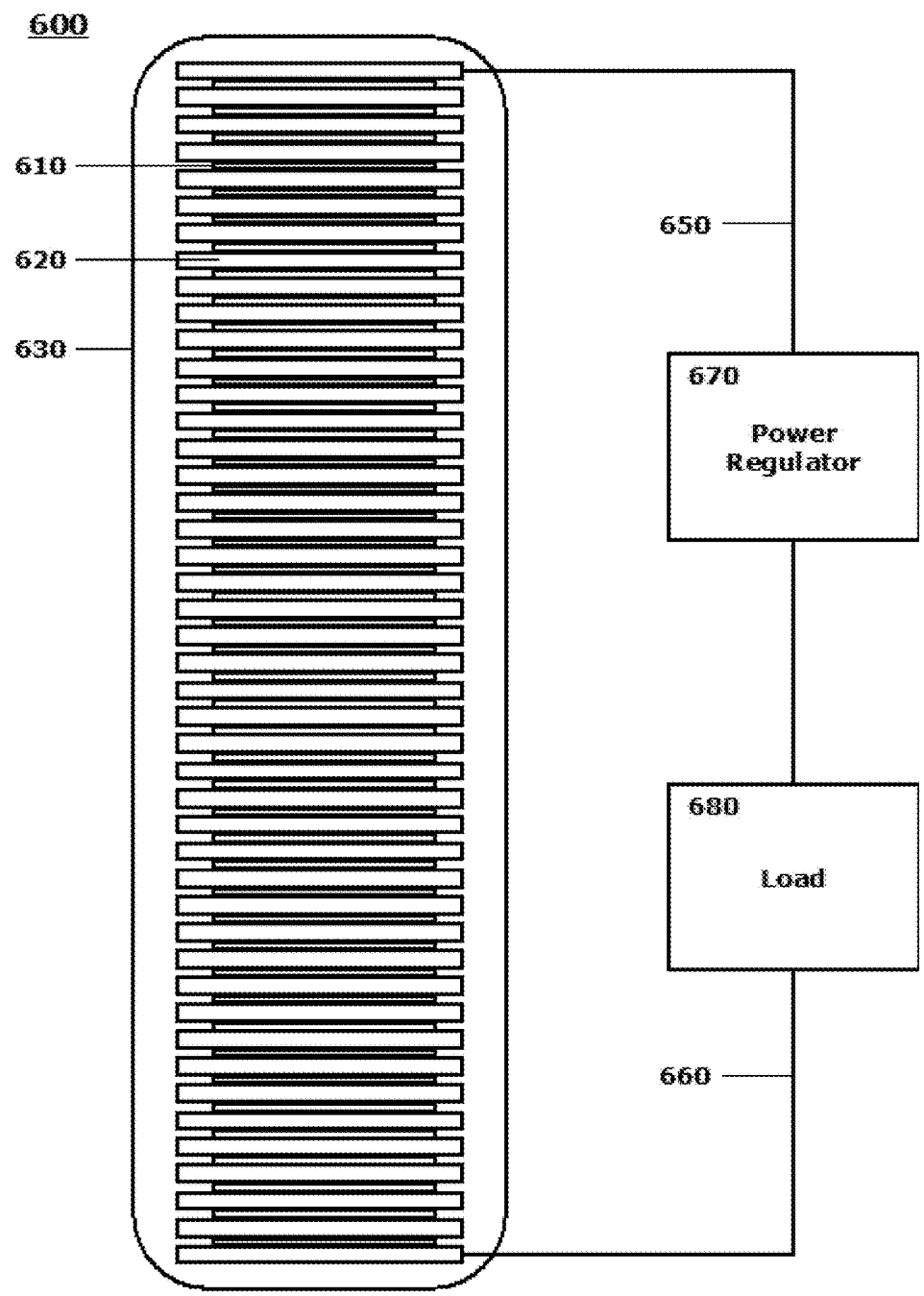
FIG. 6 illustrates a schematic diagram of an exemplary embodiment of a simple circuit powered by an EH component, including a plurality of EH elements electrically connected to each other, according to this disclosure.

FIG. 6 illustrates a schematic diagram of an exemplary embodiment of a simple circuit powered by an EH component 600 including a plurality of EH elements electrically connected to each other according to this disclosure. A structure of an EH component 600 layers appropriately-sized numbers of EH elements 610, configured as described above with reference to FIGS. 1-5, as stacks of upward to 100. Each of the EH elements 610 may be on the order of tens of nanometers thick, and sandwiched between insulating layers 620, that may be on the order each of approximately 10 μm thick. The EH elements 610 may be electrically connected in order to provide an EH component structure that produces a usable electric power output.

The EH elements 610 are generally thin and fragile. The hosting in the insulating layers 620 as a form of encasing structural components may enhance physical strength and usability, and provide a platform for connection, for example, of electrically interconnecting leads, and external wire leads 650, 660. The encasing structure will be generally comprised of an insulating material. This now-insulated stack of EH elements 610 may then be further housed in, for example, a metallic structure or structure composed, or formed, of generally any other structurally-sound materials. Because the layers are thin themselves, transitional electrically-conducting contacts may be provided in contact with the layers to provide transition between the layers, and appropriately sized load-bearing wire leads 650, 660 for connecting the EH component structure to a load 680 directly, or through some form of power regular to 670, for use.

Voltage stays constant according to a fabrication or formation of the EH component structure. Current scales with surface area of the opposing low work function and high work function surfaces. As such, power scales roughly linearly with area (similar to a solar cell). More area causes migration of more electrons resulting, in turn, when connected to a load more current at a same voltage.

As generally indicated above, a series (or stack) of sandwiched structures may be accumulated to a particular thickness of, for example, 50 to 100 (or more) individual EH elements 610 between insulating layers 620, according to the dimensions indicated below, to increase the power out. Each of the individual EH elements 610 may be considered an individual power source that is connectable in parallel or in series to others of the EH elements 610, as appropriate.

As an example of a particular conducting layer, graphene has been experimentally explored as providing favorable physical and electrical conduction properties. An amount of thermal energy available at room temperature yields a theoretical maximum power density available in a range of approximately 1 W per gram. The disclosed schemes are directed to maximizing or optimizing a surface effect. In this regard, the surface area of the thin film structure that would equate to providing this 1 Watt would be on an order of 2630 $m^2$ of surface area, approximately 51 m×51 m.

For a particular surface area of the disclosed EH component structure, a 10 $cm^2$ surface area (approximately 1.25× 1.25 inches) for EH element 610 according to the disclosed schemes may produce approximately 190 nW. Those of skill in the art recognize that this is a small amount of power and may need to be increased for most applications. Ten square centimeters is a relatively large area when compared to microelectronic devices and products of low power consumption. To scale down the packaged area, and/or to scale up the power, multiple layers may be employed in the manner shown in FIG. 6. It should be noted that, because thermal energy from the environment must flow through the additional structural layers to the inner layers, some energy harvesting reduction will be experienced for each additional internal layer added. Thermal conduction losses through the layers and thermal impedance mismatches between layers may reduce the phonon flow from the environment by a factor of upwards to 5% per EH element 610.

An exemplary experimental EH component structure approximately 10 $cm^2$ and 1 mm thick (comprising on the order of 50 internal layers, and an outer encasing layer of 12-15 mils (approximately 350 microns) is anticipated to be able to produce an electric potential of 1.2 V and an output power of 5 μW at room temperature. For reference, a typical electrically-powered men's wristwatch draws on an order of 1.0-1.2 μW.

Graphene is appropriate as the conductor layer over many other materials because the electrical conductivity in extremely thin layers and the Fermi level in the material for graphene is exceptionally good. It is much better than, for example, copper, silver or gold in these very thin layers as are called for in the disclosed embodiments. The physical characteristics are otherwise that graphene is structurally strong and durable, in order to withstand the manufacturing processes involved in the disclosed schemes without the layers of the each EH elements failing internally.

In some "installations" or use cases, it will be appropriate to additionally encase the insulated EH element layers of the EH component structure with an outer shell 630 that provides structural support and mounting for power leads 650, 660 exiting the EH component structure. A typical outer layer may be on the order of 10 mils thick and may be comprised of, for example, polyether ether ketone (PEEK).

Figure 7:
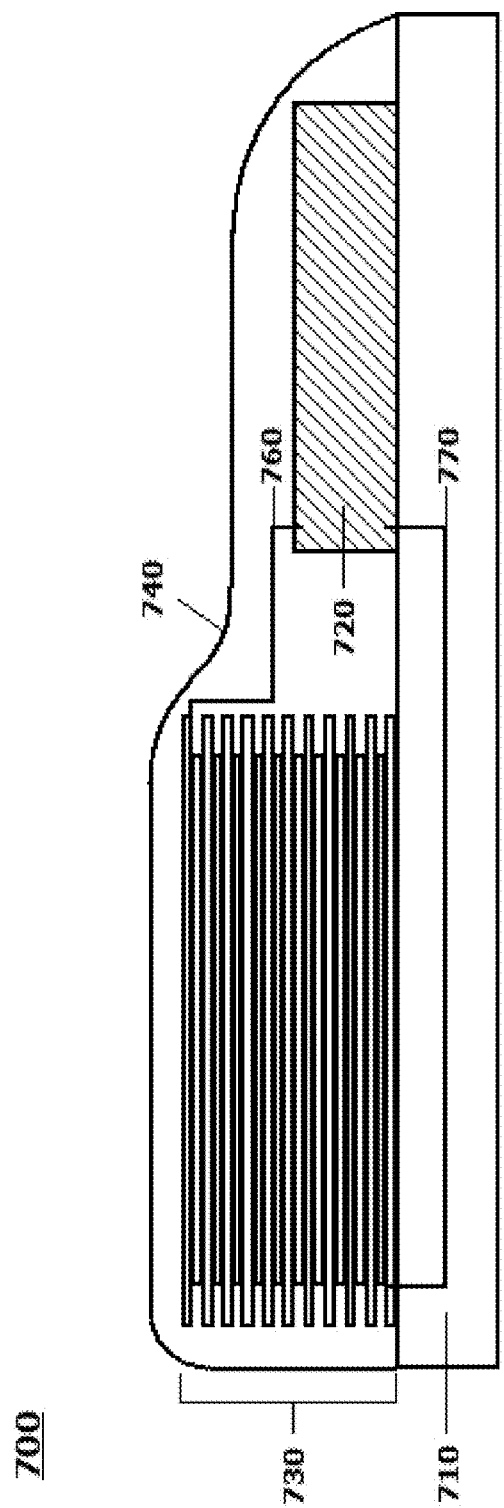
FIG. 7 illustrates a schematic diagram of an exemplary embodiment of an integrated circuit (IC) component powered by an EH component, including a plurality of EH elements electrically connected to each other, according to this disclosure.

FIG. 7 illustrates a schematic diagram of an exemplary embodiment of an integrated circuit (IC) component 700 including an integrated circuit 720 mounted on an IC substrate 710 and powered by an EH component 730, including a plurality of EH elements electrically connected to each other according to this disclosure, and to the integrated circuit 720 by power leads 760, 770. Such an EH component power supply integrated with an IC may find broad application as the EH component 730 may supply power to the integrated circuit 720 so as to remove a need for a power supply as a separate component outside the product. In embodiments, a power consumption in a main power supply for a device could be reduced with the integrated circuit 720 being independently powered by an integrated EH component 730. The products in which such IC components 700 may be mounted may result in the following beneficial outcomes: (1) smaller battery requirements, (2) extended battery life, and (3) a more focused energy harvesting capability for the main power supply. Implementations of self-powered ICs according to this disclosure could provide a full system product scheme for individual component power thereby modifying power consumption requirements for devices overall.

Incorporation of an EH component 730 in a particular IC structure 700 may require proper scaling and process compatibility with the IC manufacturing processes in order to fully integrate EH components 730 in the IC structure 700.

For an IC, the structural support may generally be provided by the IC itself in the form of an IC support layer 710.

Considering that a thickness of a typical IC in a range of approximately 8 mils (200 microns), the disclosed schemes may be usable to deposit insulation layers with a thickness on the order of 1 µm rather than 10 µm in between the deposited EH element layers in a structure similar to that described above with regard to FIG. 6. Because the structural support is coming from the IC itself, the thickness of the intermediary insulating layers can be reduced rendering a 100 layer package on the order of 100 µm or 4 mils thick. The packaging for the layered structure will be the same as the packaging 740 for the IC structure itself. As such, the thickness of the IC will be increased only on the order of 25% or so. And, a one square centimeter package for the EH component 730 at an electric potential 1.2 V, may achieve an output power of 1.0 µW at room temperature.

FIGS. 8A-8I illustrate schematic diagrams of a series of exemplary steps in a build process of an EH component, including a plurality of EH elements electrically connected to each other according to this disclosure.

Figures 8A, 8B, 8C, 8D, 8E, 8F:
FIGS. 8A-8I illustrate schematic diagrams of a series of exemplary steps in a build process of an EH component, including a plurality of EH elements electrically connected to each other, according to this disclosure.

As shown in FIG. 8A, an insulating layer 810 may be provided.

As shown in FIG. 8B, a conductor layer 820 may be provided on the insulating layer 810 according to the above-described configurations.

As shown in FIG. 8C, a surface of the conductor layer 820 may be conditioned, or may have adhered, or otherwise placed in close contact to it, a low work function layer 830 rendering the conductor layer 820 an electron donor or emitter layer.

As shown in FIG. 8D, a dielectric layer 840 according to any one of the above-described embodiments may be deposited on the low work function layer 830.

As shown in FIG. 8E, another conductor 850 may be brought into contact with the dielectric layer 840. The conductor 850 may have a comparatively higher work function to its facing surface layer. The positioning of the conductor 850 on the dielectric layer 840 completes the formation of a first EH element.

As shown in FIG. 8F, the build process may continue by providing another insulator layer 811 in contact with the conductor 850 thereby encasing the first EH element between two insulator layers 810, 811.

Figure 8G:
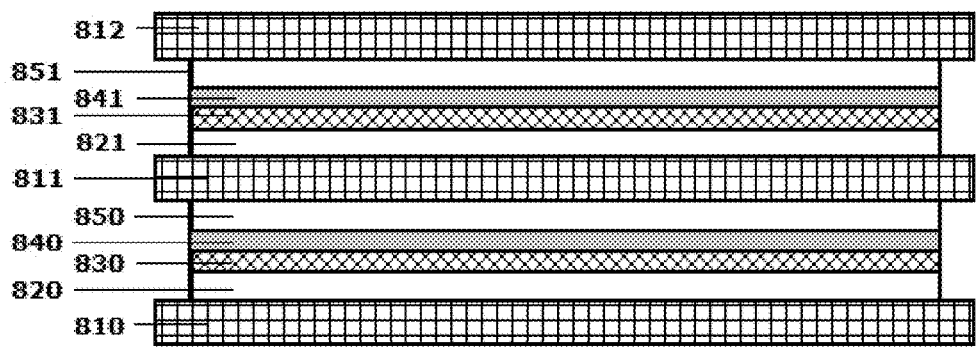

As shown in FIG. 8G, the build process depicted in FIGS. 8A-8F may be repeated in a manner that provides additional EH elements between insulator layers to construct an EH component as, for example, shown in FIG. 6, with the addition of a conductor layer 821, a low work function layer 831, a dielectric layer 841, a conductor layer 851, and another insulator layer 812.

Figure 8H:
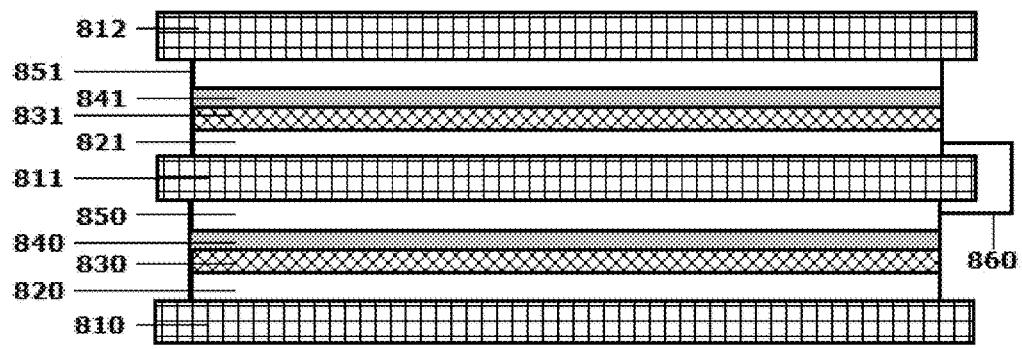

As shown in FIG. 8H, the respective EH elements may be connected in series using an internal conductor 860.

Figure 8I:
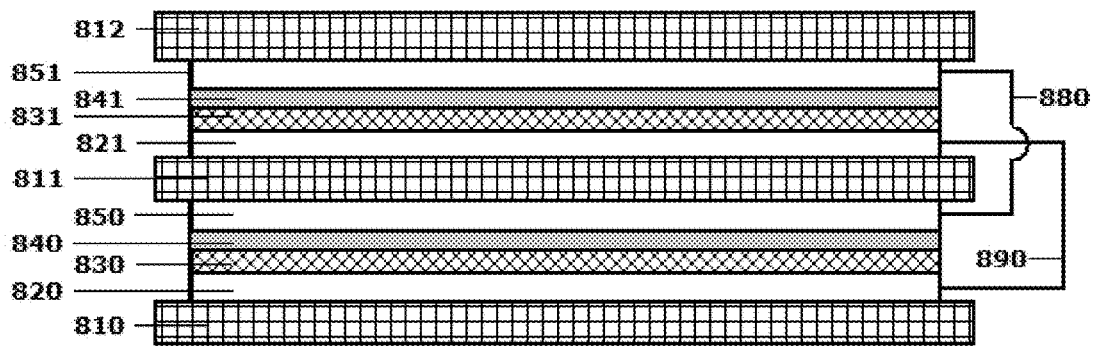

As shown in FIG. 8I, the respective EH elements may be connected in parallel using internal conductors 880 and 890.

It should be noted that the above process may be repeated a number of times until an appropriate number of layers constituting an EH conductor component is completed.

Figure 9:
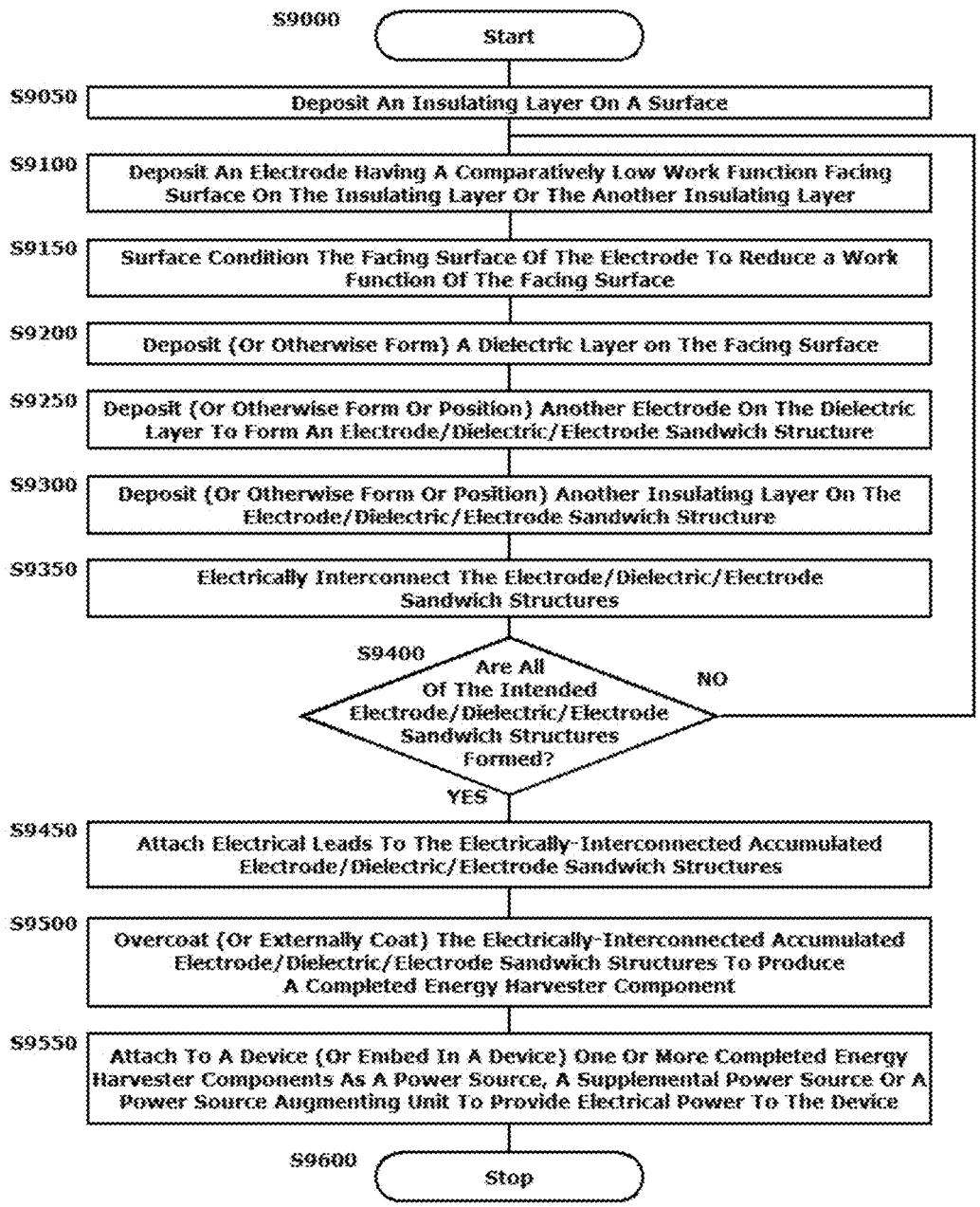
FIG. 9 illustrates a flowchart of an exemplary method for executing a build process for an EH component, including a plurality of EH elements electrically connected to each other, according to this disclosure.

The disclosed embodiments may include a method for executing a build process for an EH component including a plurality of EH elements electrically connected to each other. FIG. 9 illustrates a flowchart of such an exemplary method. As shown in FIG. 9, operation of the method commences at Step S9000 and proceeds to Step S9050.

In Step S9050, an insulating layer may be deposited or formed on a surface according to any known material deposition method. In embodiments, the insulating layer may be presented as a solid structural component placed on the surface. In embodiments, an insulating layer component may be on an order of 10 µm thick for a stand-alone EH component, or if deposited, for example, on a structure, which may include a structure on which an integrated circuit may be formed, may be on an order of 1 µm thick. Operation of the method proceeds to Step S9100.

In Step S9100, an electrode, which may be configured to have a comparatively low work function facing surface, may be deposited on the insulating layer. In embodiments, an electrode material may be deposited or placed on the insulating layer and additional measures may be taken to render the facing surface of an electrode formed of the electrode material to have a low work function. In embodiments, the electrode material may be graphene and the graphene layer may be only multiple Ångströms in thickness. Operation of the method proceeds to Step S9150.

In Step S9150, the facing surface of the electrode material may be surface conditioned to reduce a work function of the facing surface according to any of the mechanisms described above. In embodiments, the low work function surface of the electrode may be integral to the electrode, or may be an additional layer in intimate contact with the facing surface of the electrode. Operation of the method proceeds to Step S9200.

In Step S9200, a dielectric layer may be deposited or otherwise formed on the conditioned low work function facing surface of the conductor, or on the low work function layer in intimate contact with the facing surface of the conductor. The dielectric layer may be less than 100 nm thick. In embodiments, the dielectric layer may be in a range of between 20 nm and 60 nm thick. In embodiments, the dielectric layer may be formed as a substantially homogeneous single material structure. In separate embodiments, the dielectric layer may be formed of multiple materials, including multiple materials in multiple layers. In embodiments, the dielectric layer may be formed in a manner that produces a non-linear profile when viewed from at least one edge of the dielectric layer. In embodiments, at least a portion of the dielectric layer may be formed to have conically or pyramidal shape structures with a thin end being in contact with the low work surface layer and a thick end facing away from the low work surface layer in a direction orthogonal to the low work surface layer. Operation of the method proceeds to Step S9250.

In Step S9250, another electrode may be deposited, or otherwise formed or positioned, on the dielectric layer to form an electrode/dielectric/electrode sandwiched structure referred to throughout this disclosure as an EH element. The another electrode may have a facing surface layer that faces the dielectric on which the another electrode is formed, the facing surface layer of the another electrode having a work function substantially higher than the work function of the facing surface of the first-placed electrode, or the work function of the low work function layer placed in intimate contact with the first-placed electrode. In embodiments, the another electrode may be formed of a deposited metal composition or material. Operation of the method proceeds to Step S9300.

In Step S9300, another insulating layer may be deposited, or otherwise formed or positioned, on the electrode/dielectric/electrode sandwiched structure comprising the EH element. The combination of insulating layers may provide physical protection for the EH element, electrical isolation from other EH elements in a stacked configuration of an EH component, and a more substantial material structure through which electrode connections may be made to the EH element. Operation the method proceeds to Step S9350.

In Step S9350, the electrodes of the electrode/dielectric/electrode EH element may be electrically interconnected with electrodes of other EH elements when being formed as a multiple EH element stacked EH component structure. Operation of the method proceeds to Step S9400.

Step S9400 is a determination step in which it is determined whether all of the intended electrode/dielectric/electrode sandwiched structures comprising each of the EH elements are formed in a manner to comprise the overall intended composition of the EH component structure. In embodiments, there may be at least 50 separate insulator-separated EH elements electrically interconnected to one another. In embodiments, there may be as many as 100 or more separate insulator-separated EH elements electrically interconnected to one another. At present, a practical upper limit to a number of insulator separated EH element according to the disclosed embodiments has not been established. In this regard, a number of separate insulator-separated EH elements electrically interconnected to one another may exceed 100.

If in Step S9400, it is determined that all of the intended insulator-separated EH elements have not been formed in a manner that completes the intended stack, operation of the method reverts to Step S9100.

If in Step S9400, it is determined that all of the intended insulator-separated EH elements have been formed in a manner that completes the intended stack, operation of the method proceeds to Step S9450.

In Step S9450, electrical leads may be attached to the electrically-interconnected accumulated electrode/dielectric/electrode sandwich structures as the EH elements comprising the stacked EH component structure. Operation of the method proceeds to Step S9500.

In Step S9500, the electrically-interconnected accumulated electrode/dielectric/electrode sandwiched structures each comprising an individual EH element, which in combination compose an overall stacked EH component structure may be over coated or otherwise externally coated with an encasing material or an encasing structure to produce a completed EH component. Operation of the method proceeds to Step S9550.

In Step S9550, one or more completed EH component structures may be attached to, or embedded in, a device as an autonomous power source, a supplemental power source, or a power source augmenting unit to provide electrical power to the device. Operation of the method proceeds to Step S9600, where operation of the method ceases.

As is described in some detail above, the systems and methods according to this disclosure may be directed at providing autonomous, or supplemental, power to electronic systems, electronic devices, and/or electrically-powered system components, including integrated circuits.

Figure 10:
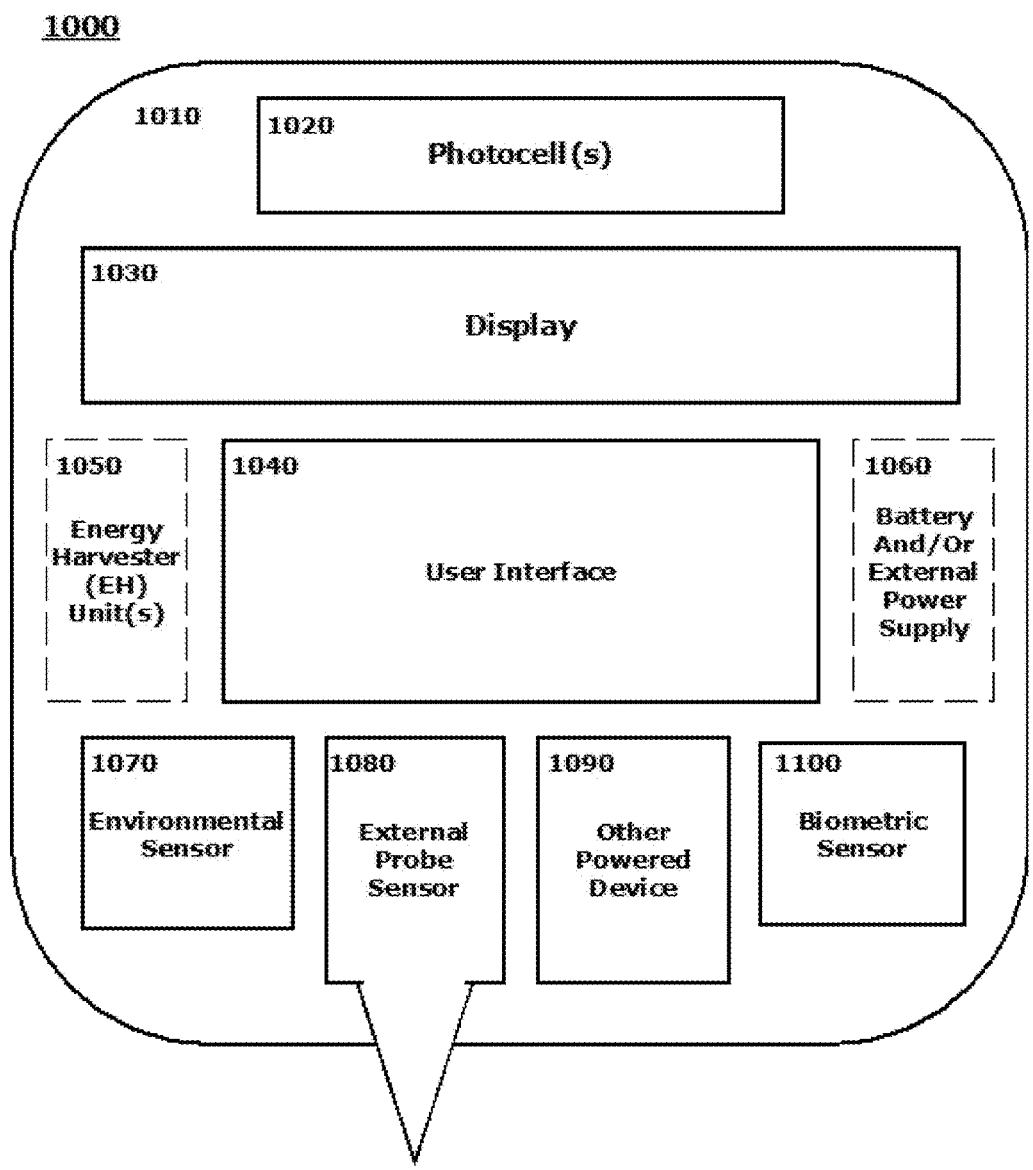
FIG. 10 illustrates a schematic diagram of an exemplary device incorporating at least at least one EH component according to this disclosure as an autonomous power source, or as a supplement to a battery, a photocell or another power source for powering the device.

FIG. 10 illustrates a schematic diagram of an exemplary device 1000 incorporating at least one EH component according to this disclosure as an autonomous power source, or as a supplement to a battery, a photocell or another power source. As shown in FIG. 10, the exemplary device 1000 may have a body structure 1010 for housing multiple elements.

One or more photocells 1020 may be provided in a face of the exemplary device 1000 to provide power to components within the exemplary device 1000. Separately, or additionally, the exemplary device may be powered by a battery or other external power supply 1060. One or more energy harvester (EH) components or units 1050 may be provided in the exemplary device 1000 as an autonomous power source, a power source for individual components within the exemplary device, or as a supplemental power source to provide bridging or sustaining power when any power recoverable from the photocells 1020 or the battery and/or external power supply 1060 becomes interrupted, or otherwise unavailable.

The exemplary device 1000 may include a display component 1030 which may be independently powered by any one of the available power sources, including being autonomously powered by one or more of the EH components or units 1050.

The exemplary device 1000 may include a user interface 1040 which may be of any known composition by which a user may interact with the exemplary device 1000.

The exemplary device 1000 may include an environmental sensor 1070. The environmental sensor 1070 may be in a form of, for example, a temperature sensor, a CO sensor, a smoke detector, a radon detector, a radiation detector, or other similar detector or detection element for sensing one or more environmental parameters.

The exemplary device 1000 may include an external probe-type sensor 1080 by which a user may use the external probe to sense any one of a number of parameters associated with an environment surrounding the exemplary device 1000 and/or a material, structure or body with which the external probe sensor may be brought into proximity, near contact, or actual contact. Such an external probe sensor may, for example, sense macro-vibrations of the material, structure or body, or of the device itself. In this context, the macro vibrations have to do with the movement of a device or body structure, rather than the micro-vibrational energy produced at the electron level on which the energy harvesting capacity of the disclosed schemes is based.

The exemplary device 1000 may include some manner of biometric sensor 1100 by which a particular biometric parameter of a human body, an animal body, or another living body structure, may be evaluated. For human body parameter detection, the biometric sensor 1100 may provide the exemplary device 1000 with a capacity, for example, to make a therapeutic diagnosis of a condition of the human body, or to monitor particular parameters by which to aid in medical diagnosis of a condition of the human body.

The exemplary device 1000 may include any other powered device 1090 that may be electrically-powered by any one of the available power sources including particularly by one or more EH components or units.

The above-described exemplary systems and methods reference certain conventional components, sensors, materials, and real-world use cases to provide a brief, general description of suitable operating, energy harvesting, and power production environments in which the subject matter of this disclosure may be implemented for familiarity and ease of understanding.

Those skilled in the art will appreciate that other embodiments of the disclosed subject matter may be practiced in many disparate electronic systems, electronic/electrical devices, or electrically-powered system components of many different configurations.

The exemplary depicted sequence of executable instructions represent one example of a corresponding sequence of acts for implementing the functions described in the steps of the above-outlined exemplary method. The exemplary depicted steps may be executed in any reasonable order to carry into effect the objectives of the disclosed embodiments. No particular order to the disclosed steps of the methods is necessarily implied by the depiction in FIG. 9 except where a particular method step is a necessary precondition to execution of any other method step.

The disclosed schemes may provide, for example, a coin cell size device that produces the same output as a coin cell battery. As such, the yield is comparable to current small battery technology for driving small electronic devices in a package that is comparatively environmentally friendly and producible at a same or a less cost than the small battery.

The disclosed schemes may provide an EH component that is capable of operating at a temperature above absolute zero and in a completely ambient light devoid environment.

The disclosed schemes may include EH elements and EH component structures that may include one or more layers being laminated together in a conventional laminating process to produce the stacked layer components described above.

The disclosed schemes may provide a unique EH capability that was unforeseen as it realistically may have been viewed by those of skill in the art as presenting a concept that, on its face, appears to be in contravention of the Second Law of Thermodynamics, which is an empirical law that is not provable. The Second Law of Thermodynamics teaches that at least two heat sources be provided with one at a lower potential than the other. Based on the heat flow of one to the other, the differential is converted to energy. This is what gives rise to the operation of a steam engine, a thermoelectric generator (TEG), the thermocouple and the like. More specifically stated, there is an energy release based on a flow of energy from a heat source to a heat sink. So in essence, the Second Law says that given a temperature differential there is an energy generation. The difficulty is that when reduced to equations, the equations based on the Second Law of Thermodynamics are reduced to zero for equal temperature (equal potential) surfaces. In other words, the Second Law of Thermodynamics would seem to imply that there is no energy recovery available from two sources at a same temperature in a sealed system. One of skill in the art, given the Second Law of Thermodynamics, would likely conclude that no charge difference is possible. It has, however, been mathematically proven that certain electron migration may occur given certain constraints (according to standard physics techniques). As such, it has been proven, that one can get work out of a single thermal reservoir of uniform temperature simply due to the molecular motion inherent in all formed bodies.

Extensive experimentation resulted in the disclosed schemes that present a very thin collector layer, and a very thin emitter layer, each of which may be of a thickness on the order of an atomic layer, i.e. 3 Å or 0.33 nm, and bring them into very close, non-contact proximity, typically on either side of the intervening layer of a comparable thickness formed of a dielectric material. The disclosed schemes implement a type of thermal energy harvesting because, at absolute zero, there is no energy harvesting capability. Thermal energy, in the context of this disclosure, and as is generally understood, is the amount of energy in a particular substance due to its molecular vibration or motion. If a substance is heated, even a little bit above absolute zero, everything in the substance is moving around a little faster and it has a certain inherent energy.

Although the above description may contain specific details, they should not be construed as limiting the claims in any way. Other configurations of the described embodiments of the disclosed systems and methods are part of the scope of this disclosure.

It will be appreciated that various of the above-disclosed and other features and functions, or alternatives thereof, may be desirably combined into many other different systems or applications. Also, various alternatives, modifications, variations or improvements therein may be subsequently made by those skilled in the art which are also intended to be encompassed by the following claims.

I claim:

1. A method for forming an energy harvesting element, comprising:
    forming a first conductor layer of a first conductive material on a support surface, the first conductor layer having a first surface facing the support surface and a second surface opposite the first surface;
    forming a low work function layer having a first work function value on the second surface of the first conductor layer; and
    arranging a second conductor layer having a first surface and a second surface opposite the low work function layer, the first surface of the second conductor layer facing the low work function layer, the second conductor layer being formed of a second conductive material and arranged to form a gap between the low work surface layer and the first surface of the second conductor layer, the gap being in a range of 100 nm or less in thickness in a direction orthogonal to the first surface of the second conductor layer, the first surface of the second conductor layer having a second work function value, the second work function value being at least 1.0 eV higher than the first work function value,
    a structure of the energy harvesting element causing the energy harvesting element to generate an electric potential between the first conductor layer and the second conductor layer.

2. The method of claim 1, the first conductor layer being formed to be less than 10 nm thick.

3. The method of claim 1, the first conductive material from which the first conductor layer is formed being graphene.

4. The method of claim 1, the low work function layer being less than 1 nm thick.

5. The method of claim 1, the forming the low work function layer comprising forming the low work function layer as a separate physical layer in intimate contact with the second surface of the first conductor layer.

6. The method of claim 1, the forming the low work function layer comprising forming the low work function layer by surface treating the first surface of the first conductor layer to lower the first work function value of the second surface of the first conductor layer.

7. The method of claim 1, further comprising forming a physical dielectric layer in the gap between the low work function layer and the first surface of the second conductor layer.

8. The method of claim 7, the physical dielectric layer being formed to have a thickness in a range of 20 nm to 60 nm and to be sandwiched between the low work function layer and the first surface of the second conductor layer.

9. The method of claim 8, further comprising forming the physical dielectric layer to have a varying thickness across a platform of the dielectric layer between the low work function layer and the first surface of the second conductor layer.

10. The method of claim 8, further comprising forming the physical dielectric layer at least in part of a plurality of tapered shapes, each of the plurality of tapered shapes having a tapered structure in which a cross-sectional area of the each of the plurality of tapered shapes is comparatively larger at an end facing the first surface of the second conductor layer and comparatively smaller at an end facing the low work function layer.

11. The method of claim 8, further comprising:
forming the dielectric layer at least in part as a porous layer; and
filling, at least partially, pores in the porous layer with a metal cation.

12. The method of claim 1, the first work function value being in a range of 1.0 eV or less and the second work function value being in a range of 2.0 eV or greater.

13. The method of claim 1, further comprising forming an insulating layer in contact with at least one of the first surface of the first conductor layer and the second surface of the second conductor layer.

14. The method of claim 1, further comprising connecting a first electric lead electrically to the first surface of the first conductor layer and a second electric lead electrically to the second surface of the second conductor layer, the first and second electric leads being configured to attach the energy harvesting element to a load.

15. A method for forming an energy harvesting component, comprising:
forming an insulating layer on a supporting surface;
forming an energy harvesting element on the insulating layer, the energy harvesting element comprising:
a first conductor layer formed of a first conductive material and having a first surface and a second surface;
a low work function layer having a first work function value formed on the second surface of the first conductor layer;
a second conductor layer formed of a second conductive material and having a first surface and a second surface, the first surface of the second conductor layer (1) facing the low work function layer, (2) forming a gap between the low work function layer and the first surface of the second conductor layer, the gap being in a range of 100 nm or less in thickness in a direction orthogonal to the first surface of the second conductor layer, and (3) having a second work function value at least 1.0 eV higher than the first work function value of the low work function layer; and
a dielectric layer formed in the gap between the low work function layer and the first surface of the second conductor layer,
a structure of the energy harvesting element causing the energy harvesting element to generate electric potential between the first conductor layer and the second conductor layer;
forming another insulating layer on the energy harvesting element;
repeating the forming the energy harvesting element in the forming another insulating layer steps until a desired stack of a number of energy harvesting elements each sandwiched between opposing insulating layers is formed as a stacked structure;
electrically interconnecting the stacked number of energy harvesting elements; and
encasing the stack of the number of energy harvesting elements in an outer insulating material structure.

16. The method of claim 15, each of the energy harvesting elements being formed of the multiple layers to be less than 300 nm thick.

17. The method of claim 15, forming each of the insulating layers to have a thickness of less than 10 μm.

18. The method of claim 15, the forming the low work function layer comprising at least one of (a) positioning a separate physical layer in intimate contact with the second surface of the first conductor layer and (b) treating the second surface of the first conductor layer to lower the first work function value of the second surface of the first conductor layer.

19. The method of claim 15, the dielectric layer being formed (1) to have a thickness in a range of 20 nm to 60 nm, and (2) to be sandwiched between the low work function layer and the first surface of the second conductor layer.

20. The method of claim 15, the dielectric layer being formed to vary in thickness across a platform of the dielectric layer between the low work function layer and first surface of the second conductor layer.

21. The method of claim 15, the forming the dielectric layer comprising forming the dielectric layer at least in part of a plurality of tapered shapes, each of the plurality of tapered shapes having a tapered structure in which a cross-sectional area of the each of the plurality of tapered shapes is comparatively larger at an end facing the first surface of the second conductor layer and comparatively smaller at an end facing the low work function layer.

22. The method of claim 15, the forming the dielectric layer comprising:
forming the dielectric layer as a porous layer; and
filling, at least partially, pores in the porous layer with a metal cation.

23. The method of claim 15, the first work function value being in a range of 1.0 eV or less and the second work function value being in a range of 2.0 eV or greater.

24. The method of claim 15, further comprising substantially encasing the stacked structure of the energy harvesting component in an outer insulating layer.

25. The method of claim 15, further comprising:
electrically connecting a first electric lead electrically to an energy harvesting element at a first end of the stack;
electrically connecting a second electric lead to an energy harvesting element at a second end of the stack; and
connecting the leads to a load.

* * * * *